(12) United States Patent  
Bang et al.

(10) Patent No.: US 7,521,788 B2
(45) Date of Patent: Apr. 21, 2009

(54) SEMICONDUCTOR MODULE WITH CONDUCTIVE ELEMENT BETWEEN CHIP PACKAGES

(75) Inventors: Hyo-Jae Bang, Cheonan-si (KR); Byung-Man Kim, Cheonan-si (KR); Dong-Chun Lee, Cheonan-si (KR); Kwang-Su Yu, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 213 days.

(21) Appl. No.: 11/233,078

(22) Filed: Sep. 23, 2005

(65) Prior Publication Data

US 2006/0102997 A1   May 18, 2006

(30) Foreign Application Priority Data

Nov. 15, 2004   (KR) ............... 10-2004-0092980  
Jul. 7, 2005   (KR) ............... 10-2005-0061252

(51) Int. Cl.
- *H01L 23/48* (2006.01)
- *H01L 21/00* (2006.01)
- *H05K 1/14* (2006.01)
- *H01R 12/00* (2006.01)

(52) U.S. Cl. ............... 257/698; 257/686; 257/724; 257/774; 257/E23.085; 361/736; 361/784; 361/790; 361/792; 438/109; 439/69

(58) Field of Classification Search .............. None  
See application file for complete search history.

(56) References Cited

U.S. PATENT DOCUMENTS

| | | | |
|---|---|---|---|
| 5,612,570 A * | 3/1997 | Eide et al. | 257/686 |
| 5,833,471 A * | 11/1998 | Selna | 439/73 |
| 6,233,150 B1 | 5/2001 | Lin et al. | |
| 6,297,960 B1 * | 10/2001 | Moden et al. | 361/719 |
| 6,414,391 B1 * | 7/2002 | Corisis et al. | 257/738 |
| 6,424,532 B2 * | 7/2002 | Kawamura | 361/708 |
| 6,504,720 B2 * | 1/2003 | Furuya | 361/699 |
| 6,523,608 B1 * | 2/2003 | Solbrekken et al. | 165/185 |
| 6,525,943 B2 * | 2/2003 | Moden et al. | 361/719 |
| 6,710,246 B1 | 3/2004 | Mostafazadeh et al. | |
| 6,730,544 B1 | 5/2004 | Yang | |
| 6,762,487 B2 * | 7/2004 | Moshayedi | 257/686 |
| 6,765,797 B2 | 7/2004 | Summers et al. | |
| 7,057,270 B2 * | 6/2006 | Moshayedi | 257/686 |

(Continued)

FOREIGN PATENT DOCUMENTS

KR   1999-0025133   7/1999

(Continued)

OTHER PUBLICATIONS

"High Density Memory Package", Aug. 1, 1990, IBM Technical Disclosure Bulletin, pp. 96-98.*

*Primary Examiner*—Alonzo Chambliss  
(74) *Attorney, Agent, or Firm*—Harness, Dickey & Pierce

(57) ABSTRACT

A semiconductor module and a method of manufacturing a semiconductor module including at least one chip package, at least one module board, at least one conductive element provided between the first chip package and the module board and a protector for applying pressure to the conductive element, the module board, and the first chip package and/or acting as a heat sink for the first chip package.

30 Claims, 15 Drawing Sheets

U.S. PATENT DOCUMENTS

2003/0168729 A1* 9/2003 Ishiwata et al. ............. 257/700
2007/0290316 A1* 12/2007 Gibson et al. ............... 257/686

FOREIGN PATENT DOCUMENTS

| | | |
|---|---|---|
| KR | 1999-0050155 | 7/1999 |
| KR | 10-0236016 | 9/1999 |
| KR | 2000-0018928 | 10/2000 |
| KR | 10-0293815 | 4/2001 |
| KR | 10-2004-0060449 | 7/2004 |

* cited by examiner

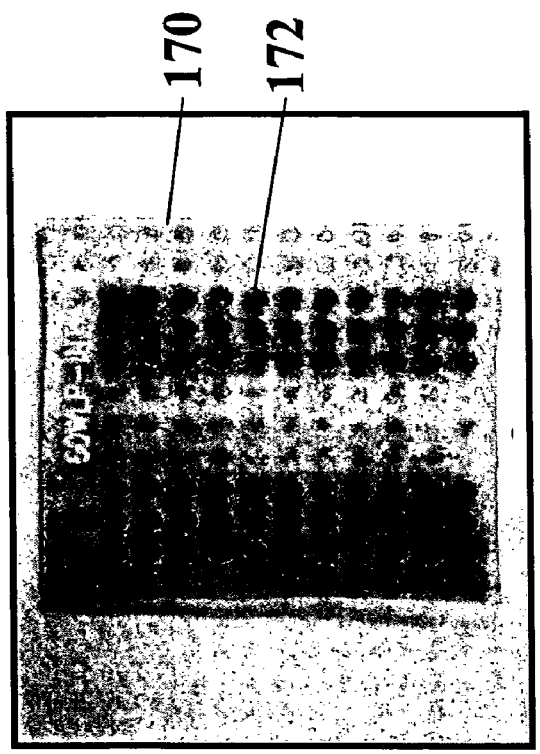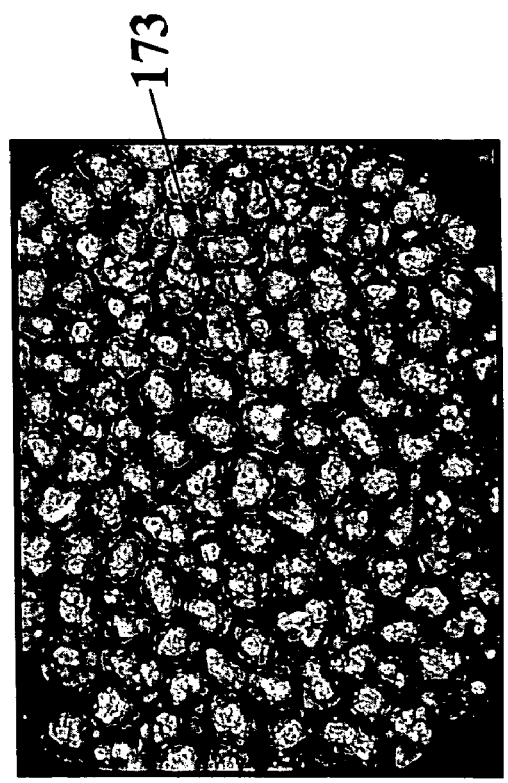
FIG. 6
FIG. 7

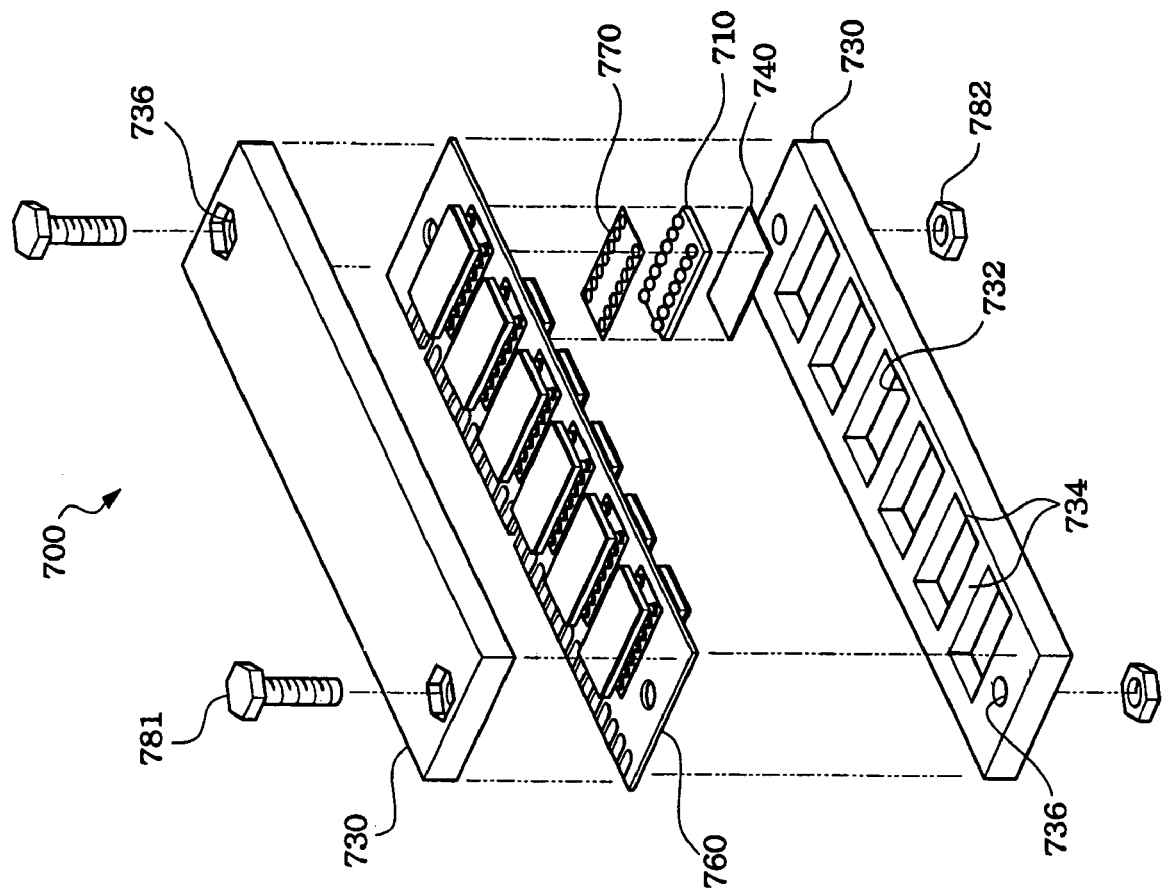
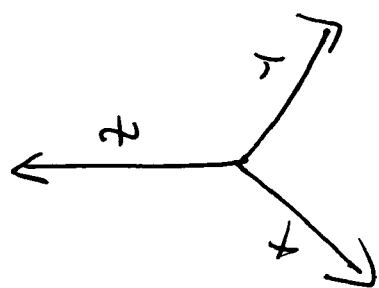
FIG. 15

SEMICONDUCTOR MODULE WITH CONDUCTIVE ELEMENT BETWEEN CHIP PACKAGES

PRIORITY STATEMENT

This U.S. non-provisional application claims priority under 35 U.S.C. § 119 of Korean Patent Application No. 2004-0092980, filed on Nov. 15, 2004 and Korean Patent Application No. 2005-0061252, filed on Jul. 7, 2005, the entire contents of both of which are incorporated by reference.

BACKGROUND OF THE INVENTION

FIG. 1 illustrates a conventional stack package of individual semiconductor packages. Referring to FIG. 1, the stack package 10 may include a plurality of individual semiconductor packages 20. Each individual semiconductor package 20 may include one or more semiconductor chips 24, a package board 22 and/or solder balls 26. The semiconductor chip 24 may be mounted on the package board 22 via an adhesive 28 interposed between the semiconductor chip 24 and the package board 22. Each individual semiconductor package 20 may be connected by the solder balls 26. The stack package 10 may be assembled by stacking the individual semiconductor packages 20 via a solder reflow process. The stack package 10 may be mounted on a module board 12.

A solder reflow process may be required during assembly of the stack package 10. Additional reflow processes may be required during testing of the stack package 10, particularly if one of the one or more semiconductor chips 24 is found to be faulty or defective during testing. Reflow processes may subject components of the stack package 10 to thermal stresses, including components of the stack package 10 which were operating correctly prior to the reflow process. The thermal stresses may damage connections, cause short circuits, warping, and other faults.

SUMMARY OF THE INVENTION

Example embodiments of the present invention relates generally to a semiconductor chip, package, or module and a method of manufacturing the same.

In an example embodiment, the present invention is directed to a semiconductor module including a first chip package, a module board, a first conductive element provided between the first chip package and the module board, and a protector for applying pressure to the first conductive element, the module board, and the first chip package.

In another example embodiment, the present invention is directed to a semiconductor module including a first chip package, a second chip package, a first conductive element provided between the first chip package and the second chip package, and a protector for applying pressure to the first conductive element.

In another example embodiment, the present invention is directed to a method of manufacturing a semiconductor module including providing a module board having one or more active areas, placing an conductive element on one or more of the active areas, placing a chip package on the conductive element, and applying pressure to the module board, the conductive element, and the chip package.

Other example embodiments of the present invention relate generally to methods of disassembling a semiconductor chip, package, or module and methods of replacing a defective chip, package, or module.

In another example embodiment, the present invention is directed to a method of disassembling a chip, package, or module including removing pressure holding a module board, at least one conductive element, and at least one chip package together and removing the at least one chip package.

In another example embodiment, the present invention is directed to a method of replacing a defective chip package in a semiconductor module including removing pressure holding a module board, a conductive element, and the defective chip package together, removing the defective chip package from the conductive element, placing an operational chip package on the conductive element, and supplying pressure to the semiconductor module to facilitate an electrical connection between the module board and the operational chip package via the conductive element.

In another example embodiment, the present invention is directed to a method of disassembling and replacing a defective chip package in a semiconductor module including removing pressure holding a module board, at least one conductive element, and the defective chip package together, removing the defective chip package, placing an operational chip package on the conductive element, and supplying pressure to the module board, the at least one conductive element, and the operational chip package.

In another example embodiment, the first conductive element may include a layer and conductive pads.

In another example embodiment, the conductive pads of the first conductive element may electrically connect the first chip package to the module board.

In another example embodiment, the layer may be made of rubber or silicon rubber and the conductive pads may include metal particles, gold particles, metal particles coated with gold, or nickel particles coated with gold.

In another example embodiment, the particles may be 20-50 μm in diameter.

In another example embodiment, the first chip package may be one of a ball grid array chip package and a land grid array chip package.

In another example embodiment, the first chip package may include a plurality of chips and a substrate.

In another example embodiment, the first chip package may include a plurality of chips and a plurality of substrates.

In another example embodiment, the protector may further act as a heat sink for the first chip package.

In another example embodiment, the heat sink may be connected to the module board to create the pressure applied to the first conductive element.

In another example embodiment, the heat sink may be arranged adjacent to the first chip package and the module board and the protector may be a "U" type clip to create the pressure applied to the first conductive element.

In another example embodiment, the heat sink may include a first portion adjacent to the first chip package and a second portion adjacent to the module board, where the first portion and the second portion are secured together.

In another example embodiment, the first portion and the second portion may be secured together with one or more bolt and nut.

In another example embodiment, the first portion and the second portion may be secured together with a compression clip.

In another example embodiment, the first portion adjacent to the first chip package and the second portion adjacent to the module board may form a pocket for the first chip package and the first conductive element.

In another example embodiment, a semiconductor module may further include a thermally conductive element interposed between the first chip package and the heat sink or between the first chip package and the module board.

In another example embodiment, a semiconductor module may further include a heat sink for the first chip package.

In another example embodiment, a semiconductor module may further include a second chip package, a second conductive element provided between the first chip package and the second chip package, the protector applying pressure to the first chip package, the first conductive element, the second chip package, the second conductive element, and the module board.

In another example embodiment, a semiconductor module may further include a second chip package, a second conductive element provided between the module board and the second chip package, the protector applying pressure to the first chip package, the first conductive element, the second chip package, the second conductive element, and the module board.

In another example embodiment, a semiconductor module may further include a first chip package array including the first chip package, a first conductive element array including the first conductive element, each first conductive element of the first conductive element array provided between each chip package of the first chip package array and the module board, the protector applying pressure to each conductive element of the first conductive element array, each chip package of the first chip package array, and the module board.

In another example embodiment, the protector may further act as a plurality of heat sinks for the first chip package array, and may further include a plurality of U-type clips arranged to create the pressure applied to the first conductive element array, the first chip package array, the plurality of heat sinks, and the module board.

In another example embodiment, a semiconductor module may further include a plurality of heat sinks, the protector including a plurality of U-type clips arranged to create the pressure applied to the first conductive element array, the first chip package array, the plurality of heat sinks, and the module board.

In another example embodiment, a semiconductor module may further include a second chip package array, including a plurality of second chip packages, a second conductive element array, each second conductive element of the second conductive element array provided between each chip package of the second chip package array and each chip package of the first chip package array, the protector applying pressure to the first conductive element array and the second conductive element array.

In another example embodiment, a semiconductor module may further include a second chip package array, including a plurality of second chip packages, and a second conductive element array, each second conductive element of the second conductive element array provided between each chip package of the second chip package array and the module board, the protector applying pressure to the first conductive element array and the second conductive element array.

In another example embodiment, the protector may further act as a plurality of heat sinks for the first chip package array and the second chip package array, and further includes a plurality of U-type clips arranged to create the pressure supplied to the first conductive element array, the first chip package array, the second chip package array, the second conductive element array, the plurality of heat sinks, and the module board.

In another example embodiment, a semiconductor module may further include a plurality of heat sinks, the protector including a plurality of U-type clips arranged to create the pressure applied to the first conductive element array, the first chip package array, the second chip package array, the second conductive element array, the plurality of heat sinks, and the module board.

In another example embodiment, the protector may further act as a plurality of heat sinks for the first chip package array and the second chip package array, the protector including a plurality of U-types clip arranged to create the pressure applied to the first conductive element array, the first chip package array, the second chip package array, the second conductive element array, the plurality of heat sinks, and the module board.

In another example embodiment, a semiconductor module may further include a plurality of heat sinks and a plurality of U-type clips arranged to create the pressure applied to the first conductive element array, the first chip package array, the second chip package array, the second conductive element array, the plurality of heat sinks, and the module board.

In another example embodiment, a semiconductor module may further include a third chip package array, including a plurality of third chip packages, a third conductive element array, each third conductive element of the third conductive element array provided between each chip package of the first chip package array and the each chip package of the third chip package array, a fourth chip package array, including a plurality of fourth chip packages, a fourth conductive element array, each fourth conductive element of the fourth conductive element array provided between each chip package of the second chip package array and the each chip package of the fourth chip package array, the protector applying pressure to the first conductive element array, the second conductive element array, the third conductive element array, and the first conductive element array conductive element array.

In another example embodiment, the protector may further act as a plurality of heat sinks for the first chip package array, the second chip package array, the third chip package array and the fourth chip package array, and further includes a plurality of U-type clips arranged to create the pressure applied to the first conductive element array, the first chip package array, the second chip package array, the second conductive element array, the third chip package array, the third conductive element array, the fourth chip package array, the fourth conductive element array, the plurality of heat sinks, and the module board.

In another example embodiment, a semiconductor module may further include a plurality of heat sinks arranged adjacent to each chip package of the third chip package array and each chip package of the fourth chip package array to create the pressure applied to the first conductive element array, the first chip package array, the second chip package array, the second conductive element array, the third chip package array, the third conductive element array, the fourth chip package array, the fourth conductive element array, the plurality of heat sinks, and the module board.

BRIEF DESCRIPTION OF THE DRAWINGS

Example embodiments of the present invention will become more fully understood from the detailed description given below and the accompanying drawings, which are given for purposes of illustration only, and thus do not limit the invention.

FIGS. 6 and 7 illustrate a PCR in an example embodiment of the present invention in more detail.

FIG. 15 illustrates a semiconductor module in accordance with another embodiment of the present invention.

It should be noted that these Figures are intended to illustrate the general characteristics of methods and devices of example embodiments of this invention, for the purpose of the description of such example embodiments herein. Further, a layer is considered as being formed (or provided) "on" another layer or a substrate when formed (or provided) either directly on the referenced layer or the substrate or formed (or provided) on other layers or patterns overlaying the referenced layer.

These drawings are not, however, necessarily to scale and may not precisely reflect the characteristics of any given embodiment, and should not be interpreted as defining or limiting the range of values or properties of example embodiments within the scope of this invention.

DETAILED DESCRIPTIONS OF EXAMPLE EMBODIMENTS

Figure 1:
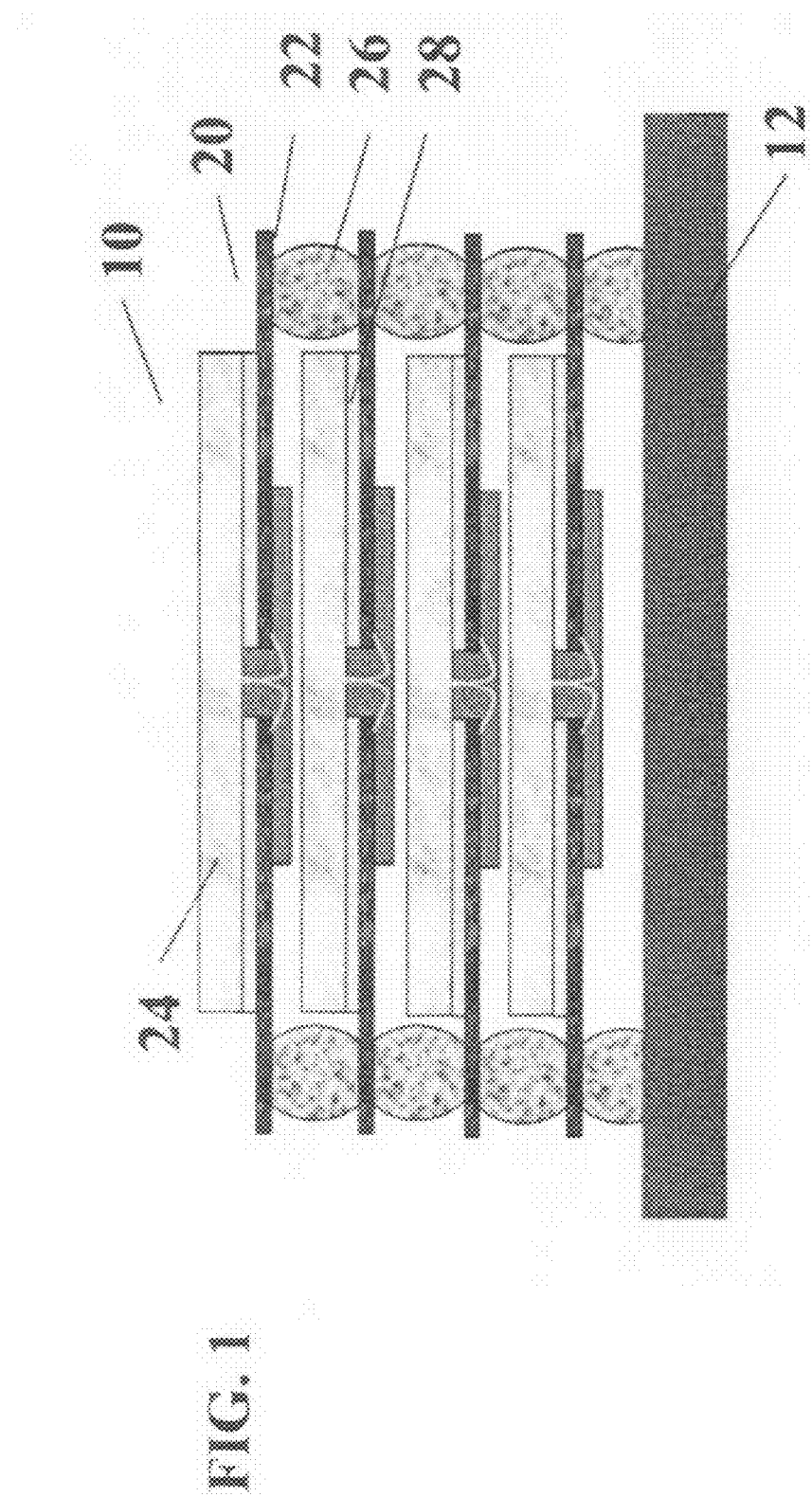
FIG. 1 illustrates a conventional stack package of individual semiconductor packages.
Figure 2:
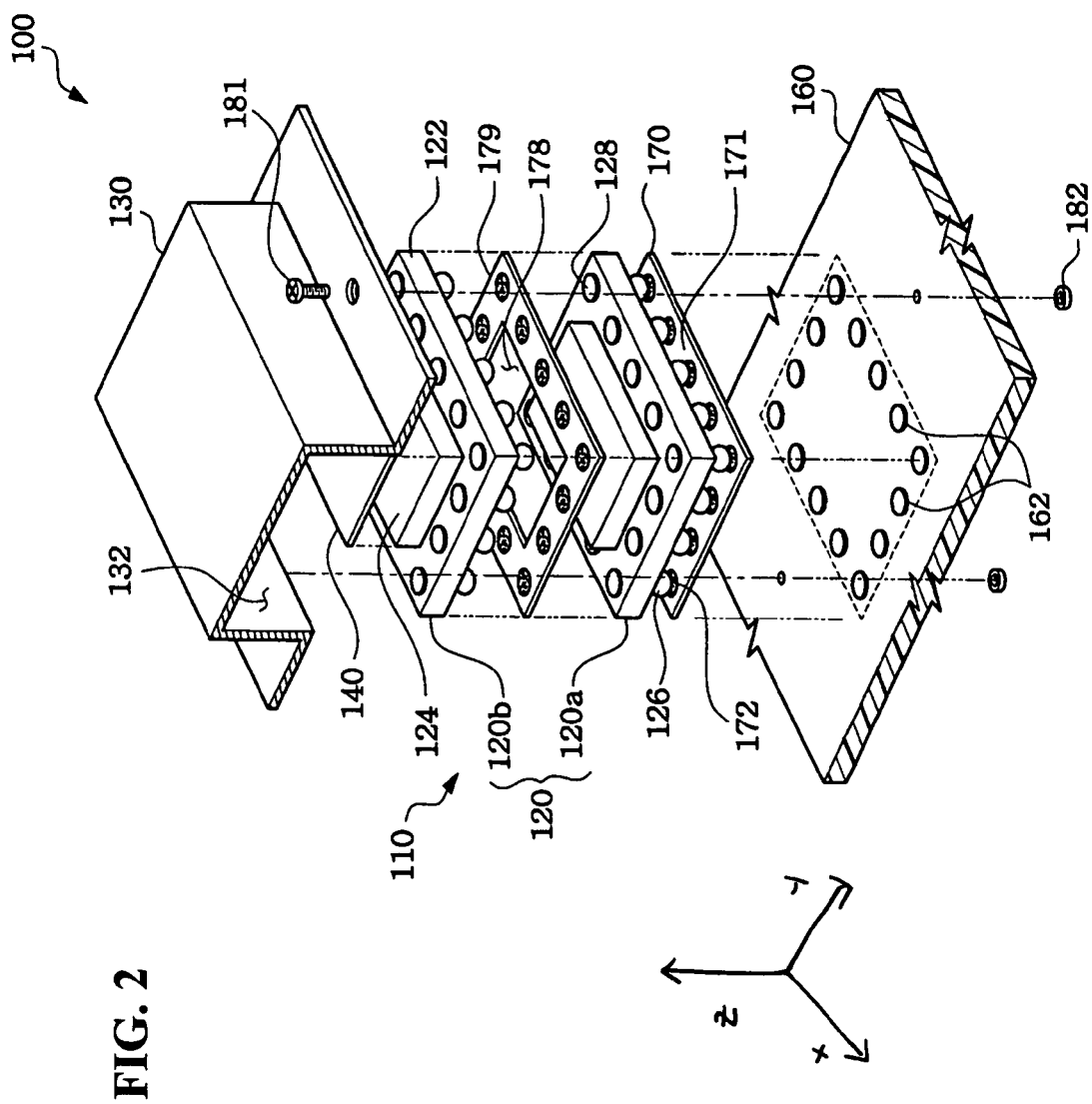
FIG. 2 illustrates a semiconductor module in accordance with an example embodiment of the present invention.

FIG. 2 illustrates a semiconductor module in accordance with an example embodiment of the present invention. Referring to FIG. 2, the semiconductor module 100 may include a stack package 110, a heat sink 130, and/or a module board 160. The heat sink 130 may include one or more recesses 132 (for example, pockets, cavities, indentations, etc.) for a semiconductor module 100 and one or more conductive elements 140. The module board 160 may include one or more module board pads 162. The stack package 110, heat sink 130, and/or module board 160 may be connected via one or more connectors, for example, a bolt 181 and a nut 182.

The stack package 110 may further include individual semiconductor packages 120a, 120b (or more generally, 120). Each individual semiconductor packages 120a, 120b may include one or more package boards 122, one or more semiconductor chips 124, solder balls 126, one or more package board pads 128, and/or one or more conductive elements 170, 179. Each conductive element 170, 179 may include an opening, for example central opening 178. Each individual semiconductor packages 120a, 120b may be connected to an adjacent semiconductor package 120n.

In an example embodiment of the present invention, the conductive element 140 may be a thermally conductive rubber (TCR). In an example embodiment of the present invention, the conductive element 170 may be an anisotropically conductive element. In an example embodiment of the present invention, the conductive element 170 may be a pressure conductive rubber (PCR). In an example embodiment of the present invention, the PCR 170 may include a rubber layer 171, one or more conductive pads 172, and/or thermally conductive particles 173, randomly provided in the rubber layer 171. In an example embodiment of the present invention, the PCR may become electrically conductive in the Z-direction (as shown in FIG. 2) upon application of pressure.

In the example embodiment of FIG. 2, pressure may be applied to the conductive element 170 via the arrangement and/or dimensions of the stack package 110, the heat sink 130, and the module board 160. In the example embodiment of FIG. 2, additional pressure may be applied by the tightening of the connector, for example, the bolt 181 and the nut 182.

In the example embodiment of FIG. 2, the heat sink 130 and the module board 160 may also protect the stack package 110 and its associated components from the external environment.

In the example embodiment of FIG. 2, the semiconductor module 100 is a mono-package, however, the semiconductor module 100 may also be a multi-package. Further, in the example embodiment of FIG. 2, the semiconductor module 100 is a single-sided package, however, the semiconductor module 100 may also be a double-sided package.

Figure 3:
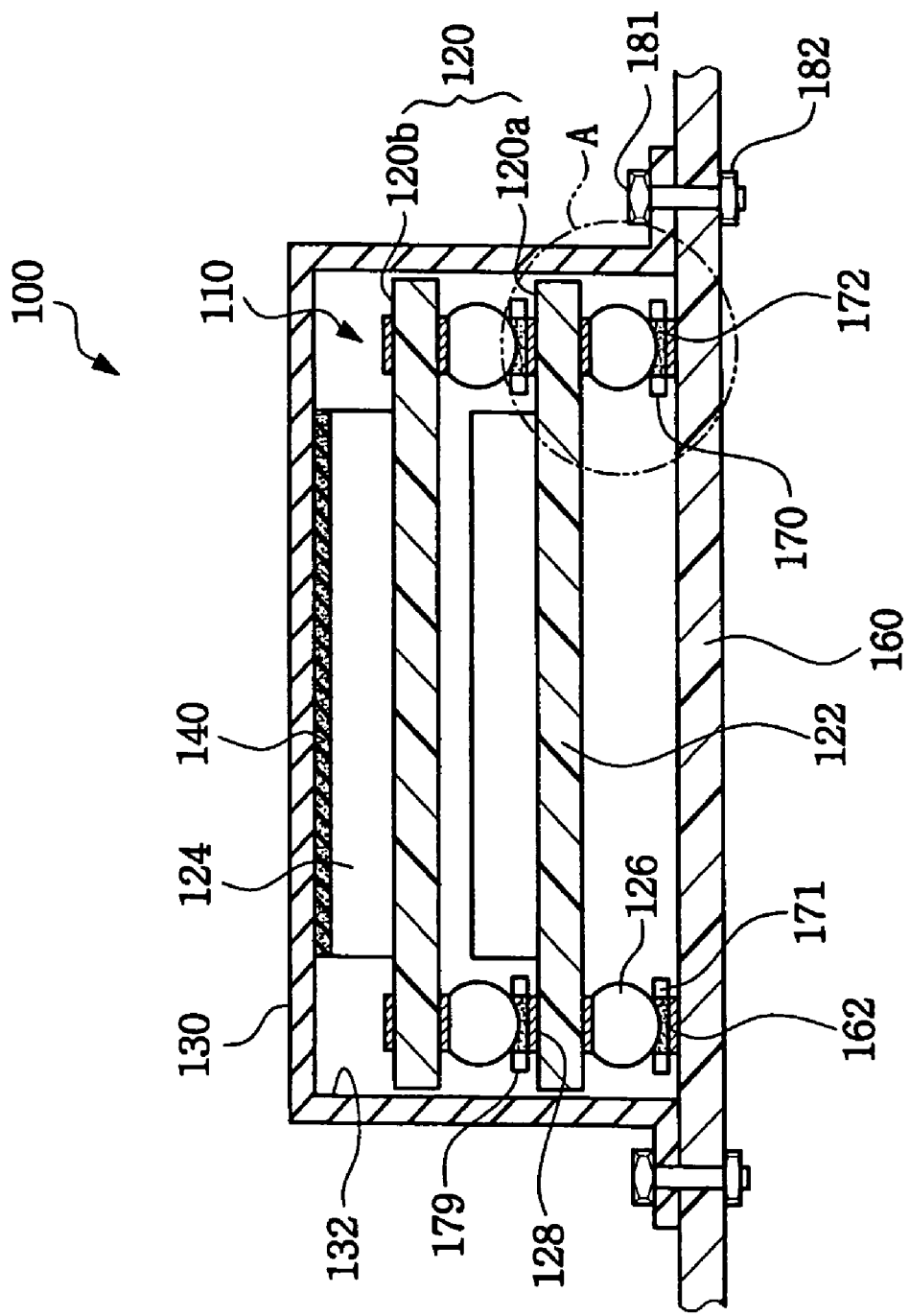
FIG. 3 is an example cross-sectional view of FIG. 2 in accordance with an example embodiment of the present invention.

FIG. 3 is an example cross-sectional view of FIG. 2. Referring to FIG. 3, the heat sink 130 may be mounted on the top most (or bottom most) semiconductor chip 124 of the stack package 110 located at the end of the stack using a thermally conductive rubber (TCR) 140. In an example embodiment of the present invention, a PCR 170 may be interposed between a solder ball 126 of an individual semiconductor chip package 120b and the board pad 128 of an adjacent semiconductor chip package 120a.

In an example embodiment of the present invention, the TCR 140 may absorb pressure applied during attachment of the heat sink 130, thereby reducing the likelihood of damaging the semiconductor chip 124.

Figure 4:
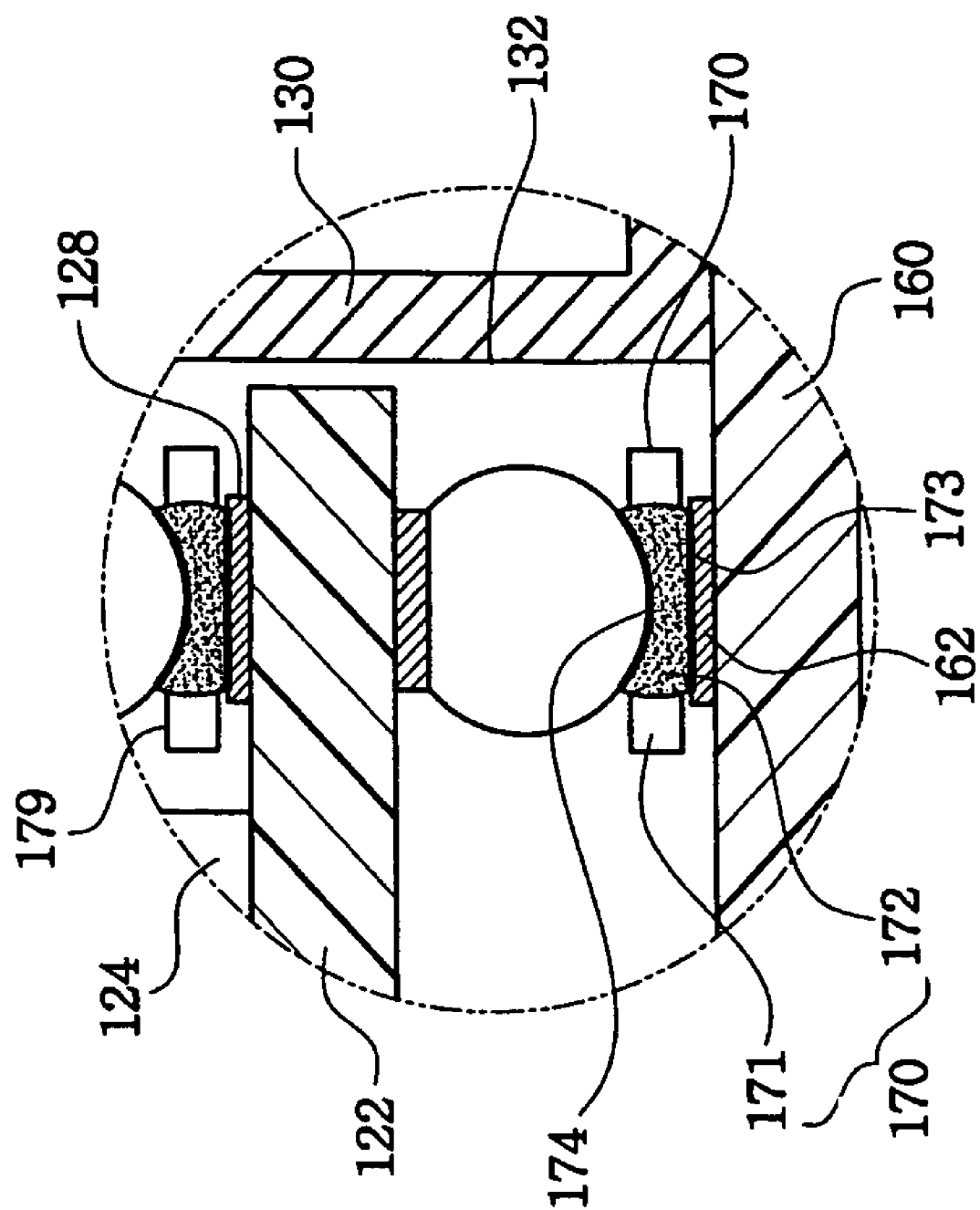
FIG. 4 is an enlarged view of area "A" in FIG. 3 in accordance with an example embodiment of the present invention.

FIG. 4 is an enlarged view of area "A" in FIG. 3 in an example embodiment of the present invention. Referring to FIG. 4, a PCR 170 may be interposed between a solder ball 126 of an individual semiconductor chip package 120a and a module board pad 162 of the module board 160. As described above, the PCR 170 may include a rubber layer 171, one or more conductive pads 172, and/or thermally conductive particles 173, randomly provided in the rubber layer 171. As shown in FIG. 4, the PCR may become electrically conductive in the Z-direction (as shown in FIG. 4) upon application of pressure, shown at 174.

Referring to FIG. 4, a PCR 179 may be interposed between a solder ball 126 of an individual semiconductor chip package 120b and a package board pad 128 of the adjacent package board 122. As described above, the PCR 179 may also include a rubber layer 171, one or more conductive pads 172, and/or thermally conductive particles 173, randomly provided in the rubber layer 171.

Figure 5:
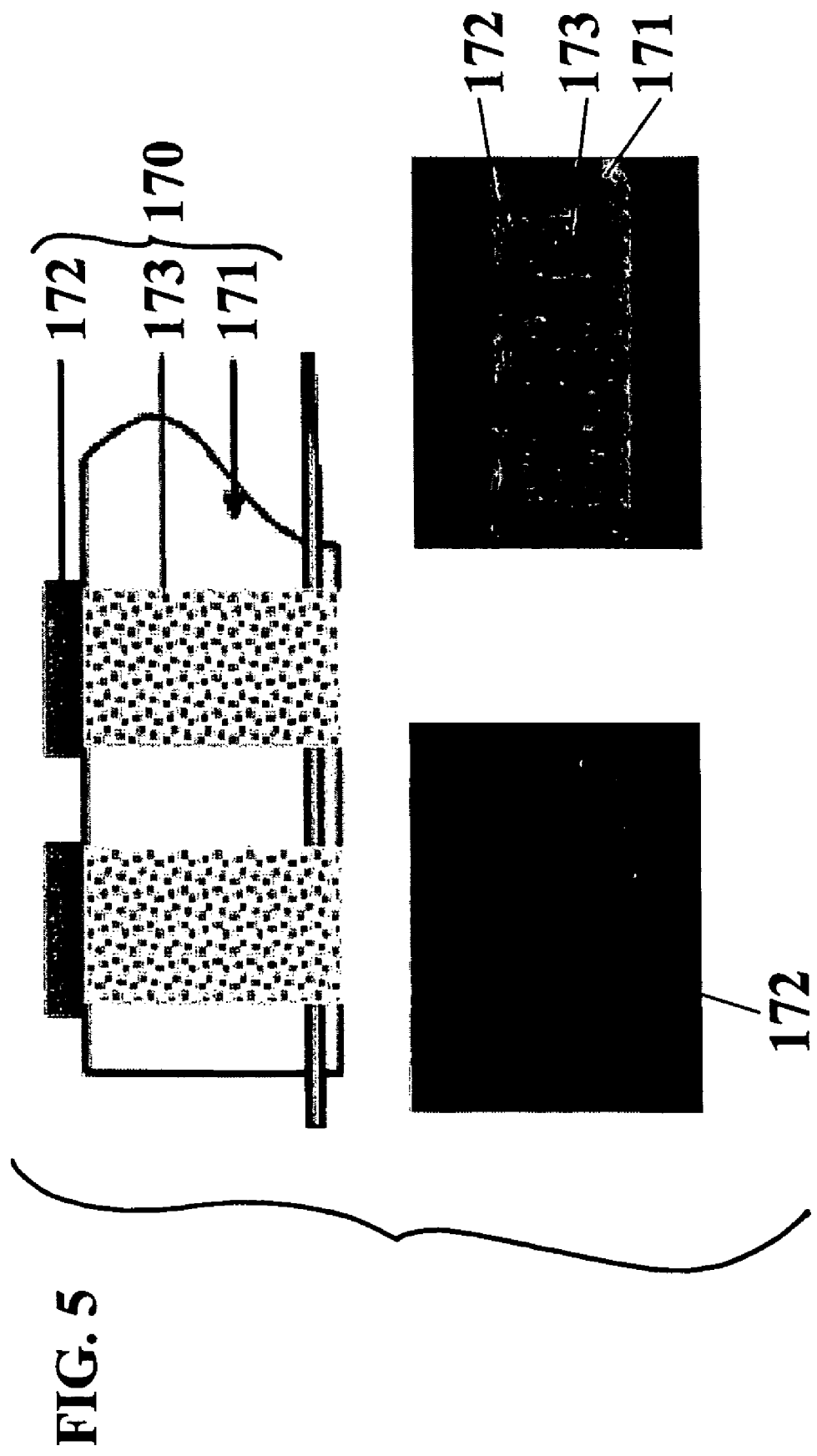
FIG. 5 illustrates a pressure conductive rubber (PCR) in an example embodiment of the present invention.

FIG. 5 illustrates a PCR in an example embodiment of the present invention. Referring to FIG. 5, the PCR 170 may include a silicon rubber layer 171, a conductive pad 172 and a plurality of particles 173 formed in the silicon rubber 171. In an example embodiment of the present invention, the particles 173 may be metal particles. In other example embodiment of the present invention, the particles 173 may be gold particles, metal particles coated with gold, and/or nickel particles coated with gold. As described above, the particles 173 may form an electrical path to an adjacent semiconductor chip package or to a module board. In an example embodiment of the present invention, a conductive pad 172 may be located on top of the PCR 170.

In an example embodiment of the present invention, the electrical connection of individual semiconductor chip packages may be made using the PCR 170 and/or the PCR 179, thereby eliminating the need for a reflow process.

FIG. 6 illustrates a PCR in an example embodiment of the present invention. Referring to FIG. 6, the layout of the conductive particles 172 may be provided in rows and/or columns depending on the corresponding layout of solder balls (or other reflowable connection) to be connected.

FIG. 7 is an example enlarged view of the PCR of FIG. 6. In an example embodiment of the present invention, each conductive particle 173 may be approximately 20 to 50 μm (inclusive) in diameter. In an example embodiment of the present invention, the conductive particles 173 may come in contact with each other to provide an electrical connection path from a solder ball, for example, solder ball 126, to an adjacent package and/or module board.

Figure 8:
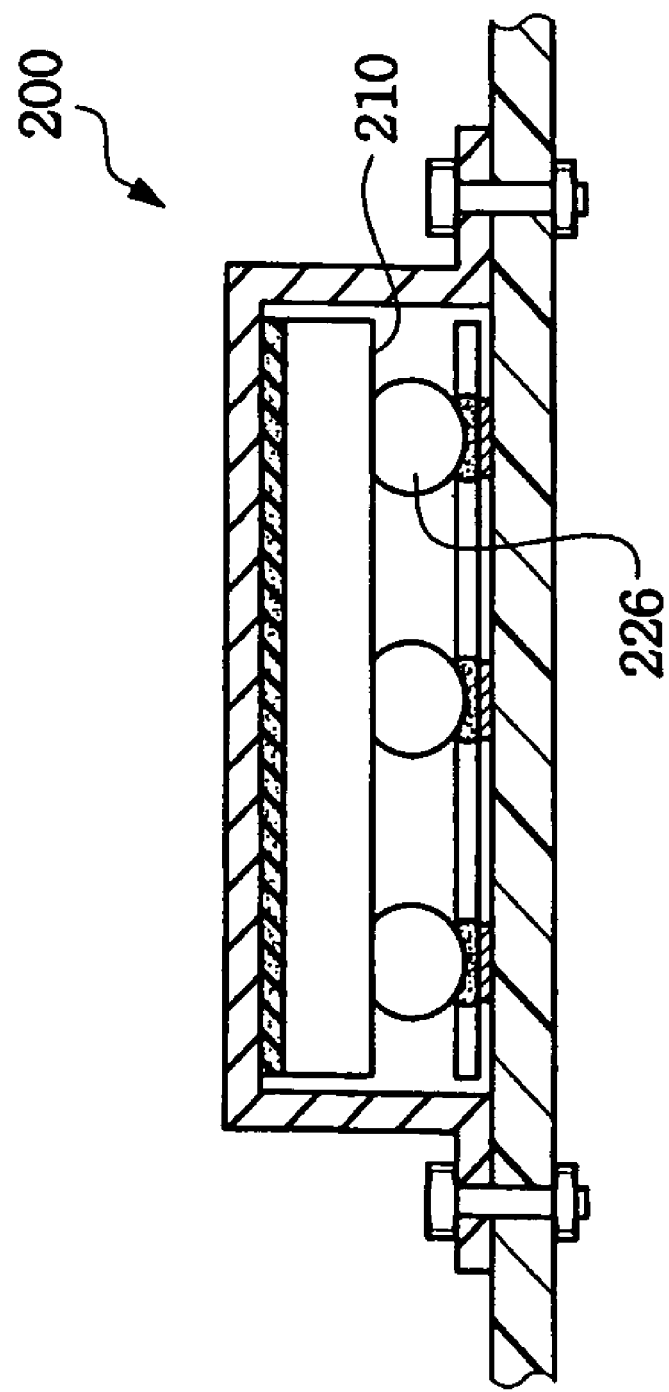
FIG. 8 illustrates a semiconductor package in accordance with another example embodiment of the present invention.

FIG. 8 illustrates a semiconductor package in accordance with another example embodiment of the present invention. Referring to FIG. 8, the stack package 210 may be one of a multi-chip package (MCP), chip scale package (CSP) or wafer level CSP (WLCSP), using solder balls 226 (or other reflowable connection).

In the example embodiment of FIG. 8, the semiconductor module 200 is a mono-package, however, the semiconductor module 200 may also be a multi-package. Further, in the example embodiment of FIG. 8, the semiconductor module 200 is a single-sided package, however, the semiconductor module 200 may also be a double-sided package. In an example embodiment of the present invention, a semiconductor chip package 210 may be provided on opposite major surfaces of the module board.

Figure 9:
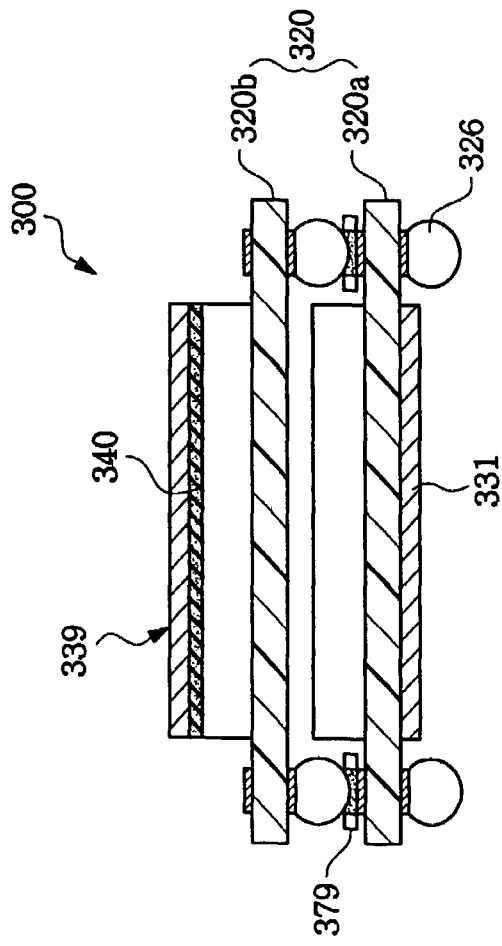
FIGS. 9 and 10 illustrate a stack package in accordance with another example embodiment of the present invention.
Figure 10:
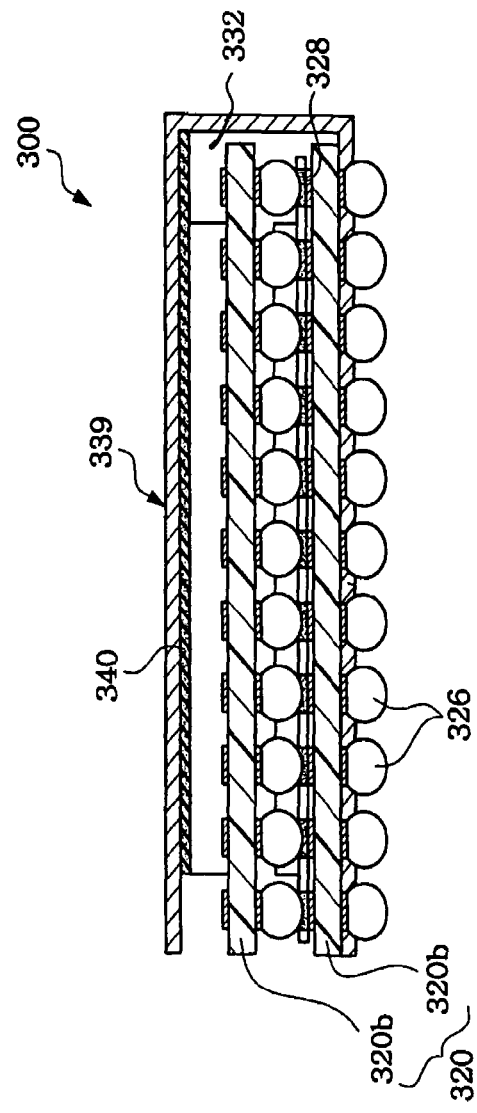

FIGS. 9 and 10 illustrate a stack package in accordance with another example embodiment of the present invention. Referring to FIGS. 9 and 10, a stack package 300 may include individual semiconductor packages 320a, 320b (or more generally, 320), one or more conductive elements 340, one or more conductive elements 379 (for example, a PCR), one or more solder balls 326 (or other reflowable connection), one or more board pads 328, and/or one or more heat sinks 339 and 331. In an example embodiment of the present invention, the heat sink 339 is a clip, for example, a "U" type clip. The heat sink 339 may include one or more recesses 332 (for example, pockets, cavities, indentations, etc.) for a semiconductor chip, package, or module and one or more conductive elements 340. The heat sink 339 may be used to mechanically connect the individual semiconductor package 320a, 320b, etc. and the PCR 379.

In an example embodiment of the present invention, the PCR 379 may become electrically conductive in the Z-direction (as shown in FIG. 10) upon application of pressure.

In the example embodiment of FIG. 10, pressure may be applied to the PCR 379 via the arrangement and/or dimensions of the stack package, including the individual semiconductor packages 320n, one or more conductive elements 340, and the one or more heat sinks 339. In an example embodiment of FIG. 10, the heat sink 339 provides pressure and a heat dissipation function. In another example embodiment of FIG. 10, the heat sink 339 may provide a heat dissipation function (and need not be of "U" shape) and a separate clip (which may be of "U" shape) may provide compression and/or pressure.

Figure 11:
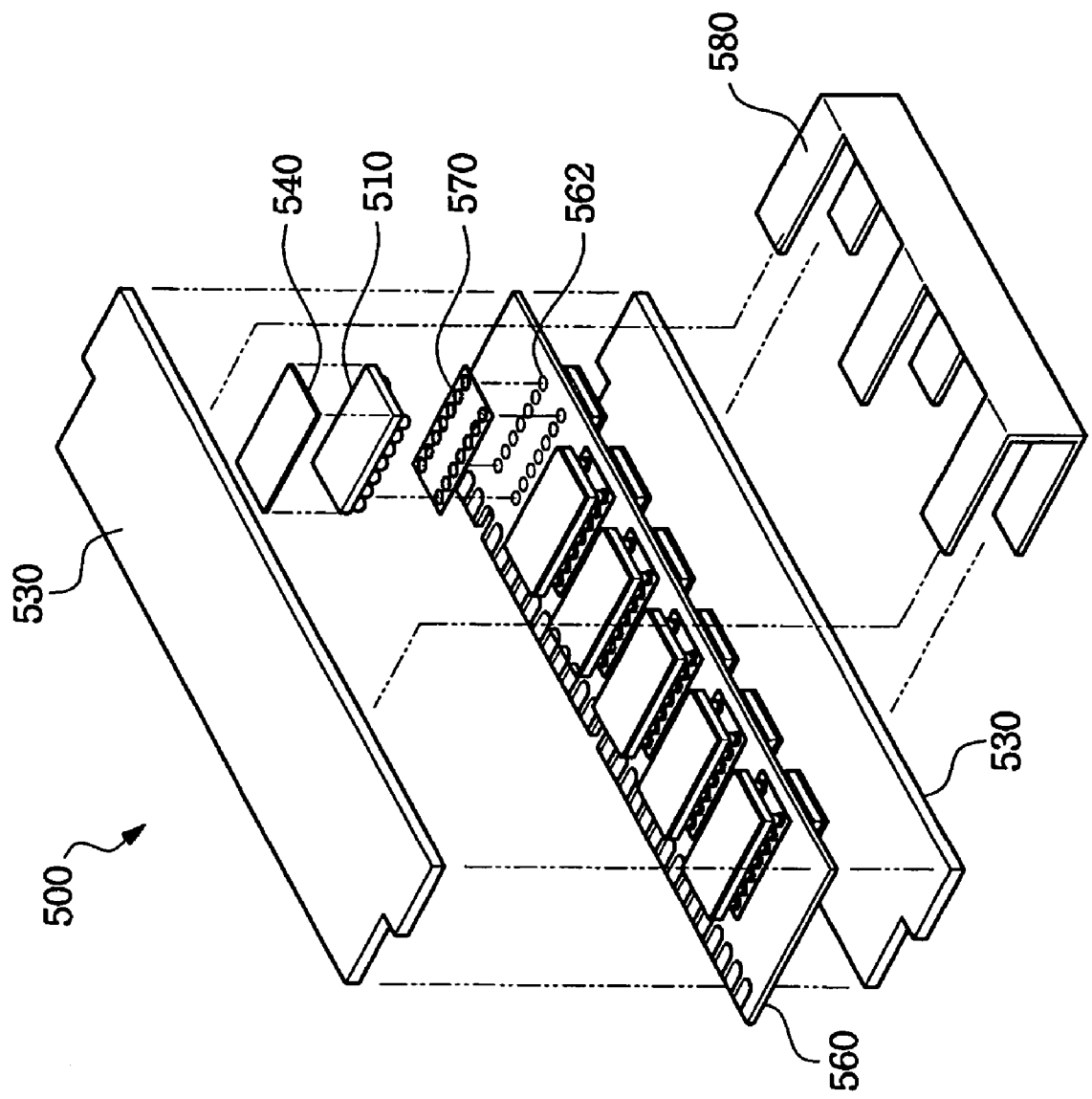
FIGS. 11 and 12 illustrate a semiconductor module in accordance with another example embodiment of the present invention.
Figure 12:
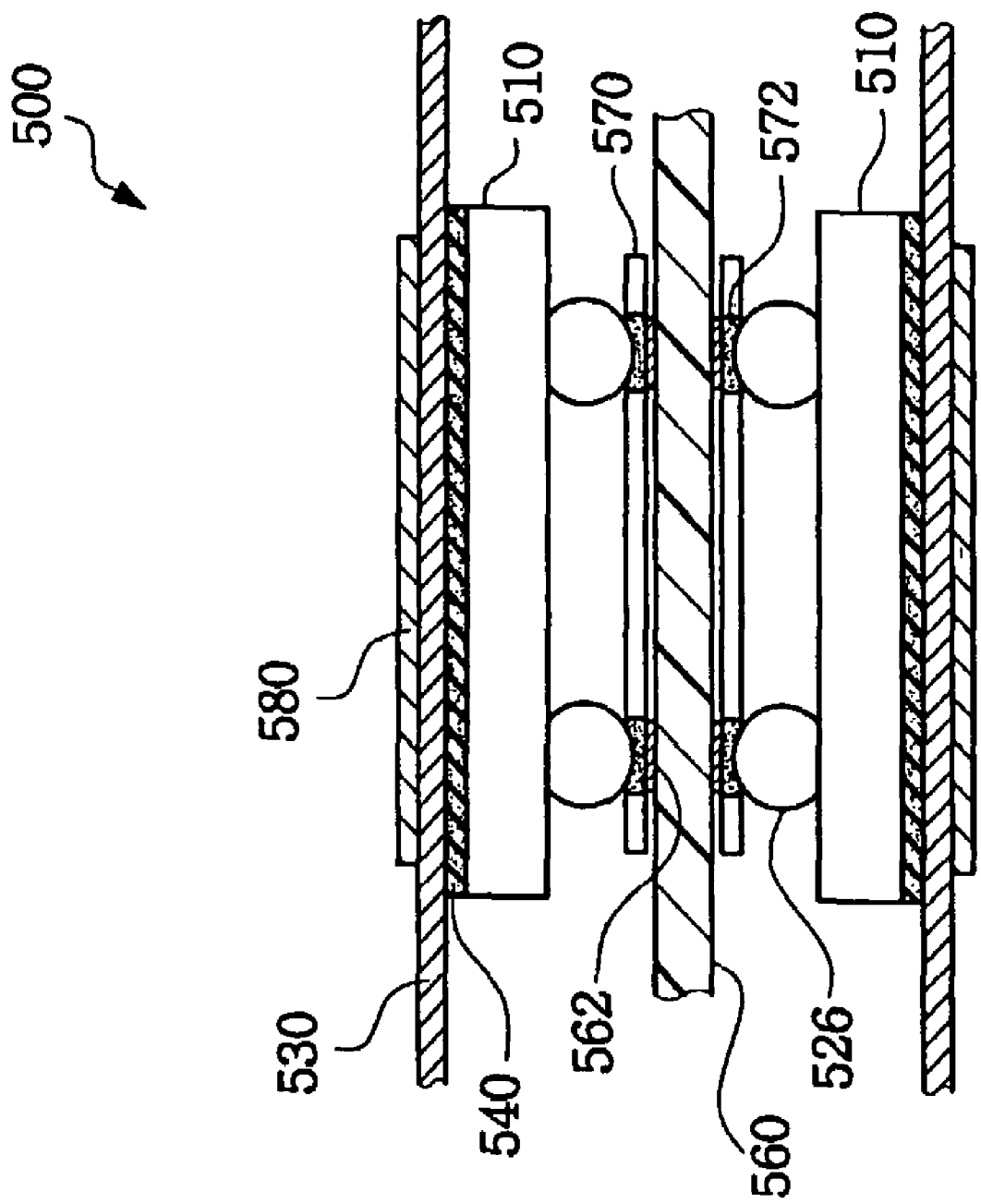

FIGS. 11 and 12 illustrate a semiconductor module in accordance with another example embodiment of the present invention. Referring to FIGS. 11 and 12, the semiconductor module 500 may include a package 510 with one or more solder balls 526, one or more heat sinks 530, and/or a module board 560. The heat sink 530 may include two or more parts for the package 510 and one or more conductive elements 540. The module board 560 may include one or more module board pads 562 on one major side and one or more module board pads 572 on another major side. The stack package 110, heat sinks 530, and/or module board 560 may be connected via a compression clip 580. The compression clip 580 may be used to mechanically connect the heat sinks 530, the module board 560, and the PCR 570.

In an example embodiment of the present invention, the PCR 570 may become electrically conductive in the Z-direction (as shown in FIGS. 11 and 12) upon application of pressure.

In the example embodiment of FIGS. 11 and 12, pressure may be applied to the PCR 570 via the arrangement and/or dimensions of the stack package 510, including the individual semiconductor packages, one or more conductive elements 540, and the heat sinks 530. In an example embodiment of FIGS. 11 and 12, the heat sinks 530 provide a heat dissipation function and the compression clip 580 provides compression and/or pressure.

Figure 13:
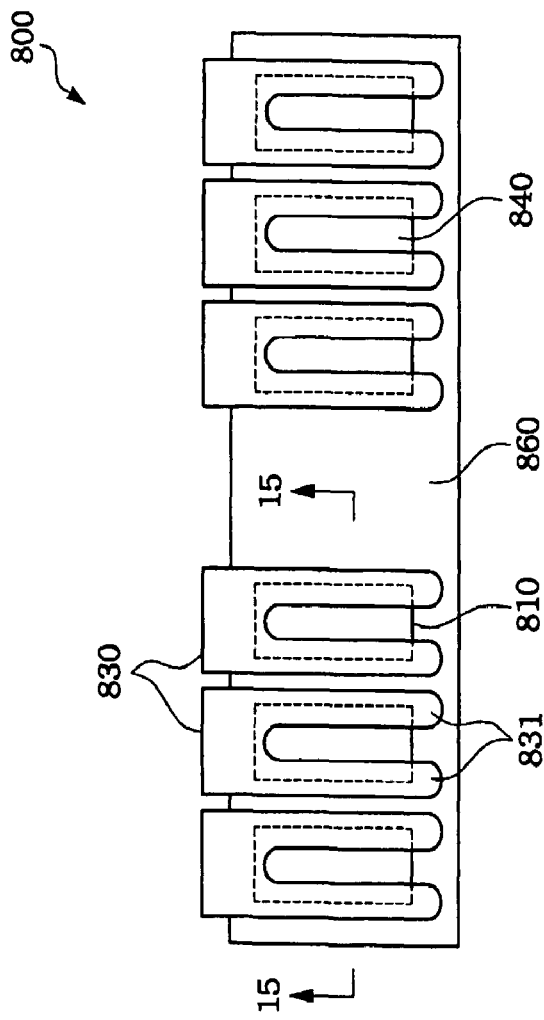
FIGS. 13 and 14 illustrate a semiconductor module in accordance with another example embodiment of the present invention.
Figure 14:
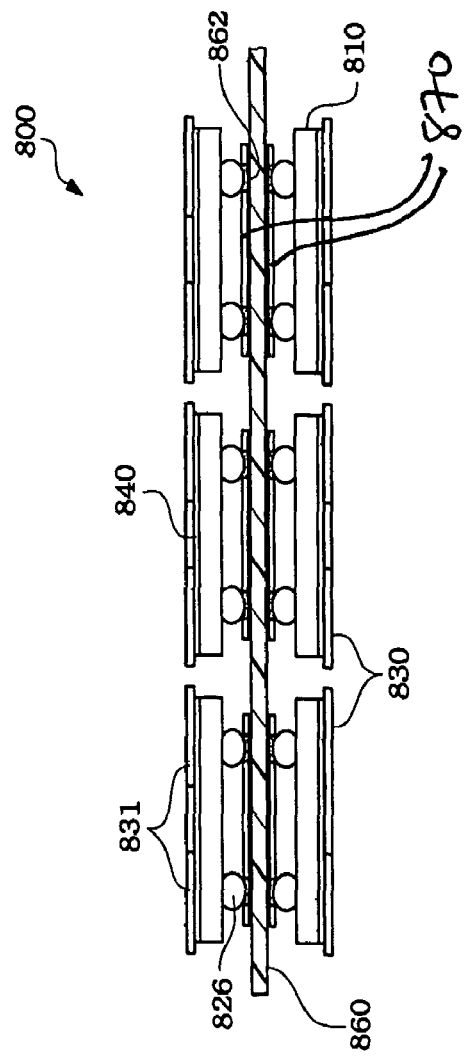

FIGS. 13 and 14 illustrate a semiconductor module in accordance with another example embodiment of the present invention. Referring to FIGS. 13 to 14, the semiconductor module 800 may include a semiconductor package 810 of a plurality of stacked chips with one or more solder balls 826, a plurality of individual heat sinks 830, a module board 860, and/or one or more PCRs 870. The module board 860 may include one or more module board pads 862 on either major side. In an example embodiment of the present invention, each heat sink 830 may include one or more fingers 831 and may be used to mechanically connect together a semiconductor package 810, a TCR 840 and the module board 860. In an example embodiment of the present invention, the individual heat sinks 830 may facilitate repair or replacement of a faulty semiconductor chip package.

In an example embodiment of the present invention, the PCR 870 may become electrically conductive in the Z-direction (as shown in FIG. 14) upon application of pressure.

In the example embodiment of FIGS. 13 and 14, pressure may be applied to the PCR 870 via the arrangement and/or dimensions of the stack package 810, including the individual semiconductor packages, one or more conductive elements 840, and the plurality of individual heat sinks 830. In an example embodiment of FIGS. 13 and 14, the plurality of individual heat sinks 830 may individually provide a heat dissipation function and compression/pressure to a corresponding stack of chips, packages, or modules.

FIG. 15 illustrates a semiconductor module in accordance with another embodiment of the present invention. Referring to FIG. 15, the semiconductor module 700 may include a semiconductor package 710 of a plurality of stacked chips, heat sinks 730, one or more conductive elements 740, one ore more conductive elements 770, a module board 760 and/or one or more connectors 781, 782. The stack package 710, heat sinks 730, and/or module board 760 may be connected via one or more connectors, for example, a bolt 781 and a nut 782.

In an example embodiment of the present invention, the heat sinks 730 may be detachable and may facilitate repair or replacement of a faulty semiconductor package.

In an example embodiment of the present invention, the heat sinks 730 may have a plurality of recesses 732 (for example, pockets, cavities, indentations, etc.) to hold a corresponding semiconductor package.

In an example embodiment of the present invention, the PCR 770 may become electrically conductive in the Z-direction (as shown in FIG. 15) upon application of pressure. In the example embodiment of FIG. 15, pressure may be applied to the PCR 770 via the arrangement and/or dimensions of the stack package 710, including the individual semiconductor packages, one or more conductive elements 740, the heat sink 730, and the plurality of recesses 732. In an example embodiment of FIG. 15, the heat sink 730 may provide a heat dissipation function and compression/pressure to a plurality of stacked chips.

Figure 16:
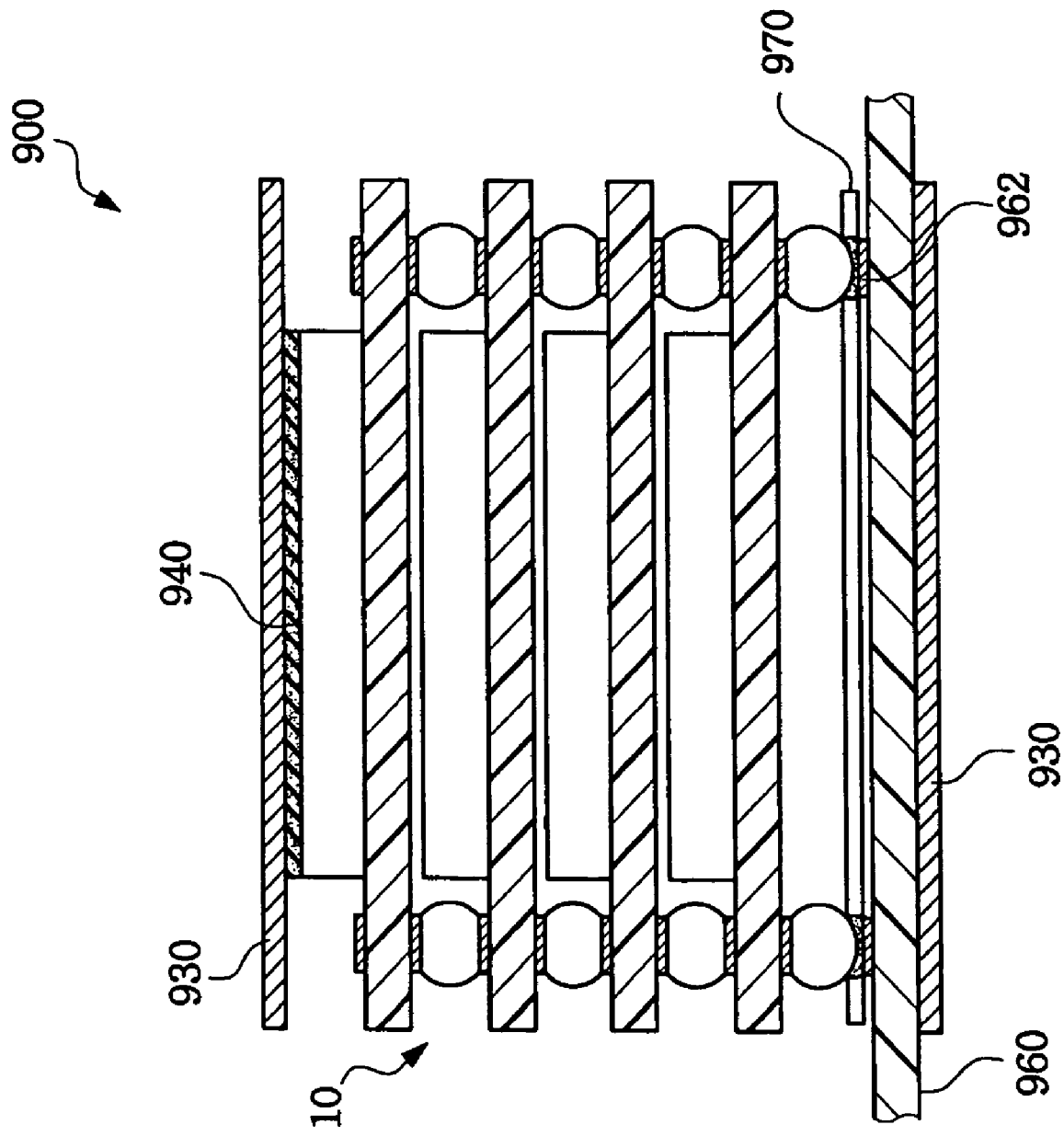
FIG. 16 illustrates a semiconductor module based on stacking individual chip packages in accordance with another example embodiment of the present invention.

FIG. 16 illustrates a semiconductor module based on stacking individual chip packages in accordance with another example embodiment of the present invention. Referring to FIG. 16, the stacked semiconductor chip package 900 may include a stack package 10, heat sinks 930, a module board 960 with one or more module board pads 962, and/or one or more PCRs 970. Referring to FIG. 16, the stacked semiconductor chip package 900 may be connected to the module board 960 using the PCR 970.

In an example embodiment of the present invention, the PCR 970 may become electrically conductive in the Z-direction (as shown in FIG. 16) upon application of pressure. In the example embodiment of FIG. 16, pressure may be applied to the PCR 770 via the arrangement and/or dimensions of the stack package, including the individual semiconductor packages, one or more conductive elements 940, and the heat sink 930. In an example embodiment of FIG. 16, the heat sink 930 may provide a heat dissipation function and/or compression/pressure to a stack of chips.

Figure 17:
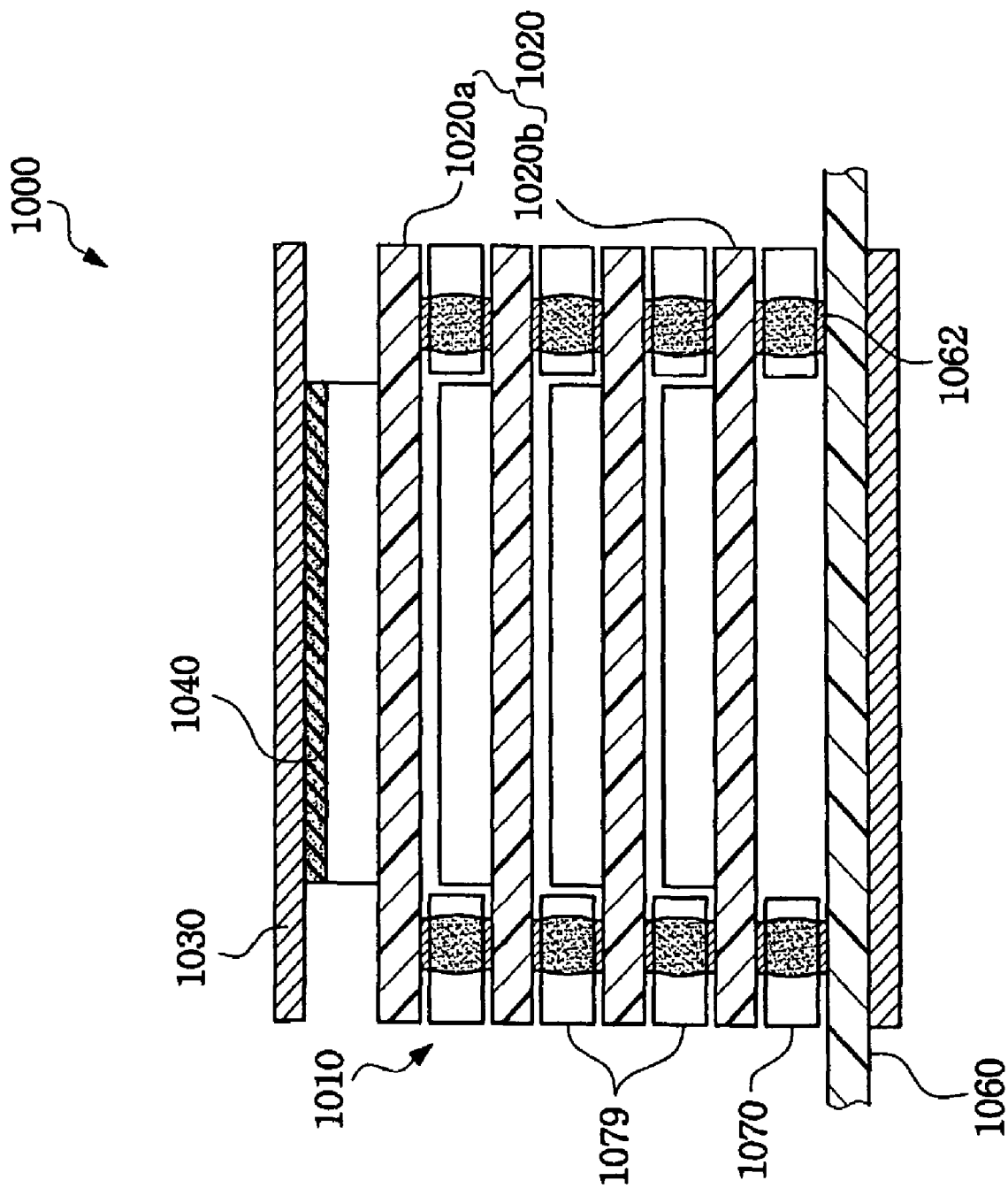
FIG. 17 illustrates a semiconductor module based on stacking individual chip packages in accordance with another example embodiment of the present invention.

FIG. 17 illustrates a semiconductor module based on stacking individual chip packages in accordance with another example embodiment of the present invention. Referring to FIG. 17, the stacked semiconductor chip package 1000 may include a stack package 1010, heat sinks 1030, a module board 1060 with one or more module board pads 1062, and/or a PCR 1070, 1079. Referring to FIG. 17, an individual chip package 1010 may be a land grid array (LGA). In an example embodiment of the present invention, each semiconductor chip package 1010 may be connected by using the PCB 1070, 1079.

In the example embodiment of FIG. 17, pressure may be applied to the PCR 1070, 1079 via the arrangement and/or dimensions of the stack package 1010, including the individual semiconductor packages 1020 which may include 1020a and 1020b, one or more conductive elements 1040, and the heat sink 1030. In an example embodiment of FIG. 17, the heat sink 1030 may provide a heat dissipation function and/or compression/pressure to a stack of chips.

As described above, any of the example embodiments of the semiconductor modules of the present invention, may be used in ball grid arrays (BGAs), land grid arrays (LGAs), or other known arrays.

As described above, any of example embodiments of the semiconductor modules of the present invention may include any number of packages, any number of chips, any number of modules and/or any number of substrates. As described above, any of example embodiments of the semiconductor modules of the present invention may include any number of intermediate substrates between chips, packages, and/or modules, such as for example, package boards, as described above, as well as any number of major substrates, such for example, module boards, as described above.

Further, any of the example embodiments of the semiconductor modules of the present invention may be arranged in any number of configurations, including but not limited to, one-dimensional arrays, two-dimensional arrays, single-sided configurations, and/or double-sided configurations.

Although example embodiments have been described as being secured by a bolt and a nut, other connectors, for example, screws, etc. may also be utilized.

Although example embodiments have been described as providing pressure or compression by, for example, adjusting dimensions, adjusting tightness or tension, providing elements under pressure (for example, a compression clip or U type clip), pressure or compression may provided by any other technique.

Although example embodiments have been described in conjunction with solder balls or other reflowable connections, the conductive elements described above, for example, the PCRs 170, 179, 379, 570, 770, 870, 970, 1070, and/or 1079 need not be used in conjunction with reflowable connections, but rather may be used in conjunction with other non-reflowable connections. Examples of reflowable connections include solder balls, solder paste, solder bumps, and/or solder plugs. Examples of non-reflowable connections include pins, springs, and/or posts.

As described above, the conductive elements described above, for example, the PCRs 170, 179, 379, 970, 1070, and/or 1079 may be arranged between a first chip package and a second chip package or between a chip package and a substrate, for example a module board or package board.

As described above, the conductive elements described above, for example, the PCRs 170, 179, 379, 970, 1070, and/or 1079 may be arranged between some chip packages of a chip package array and between some chip packages of a chip package array and a substrate, for example, a module board or package board.

As described above, the heat sink(s) 130, 339, 530, 730, 830, 930, and 1030 may provide a heat dissipation, may provide compression and/or pressure, and/or may provide protection from the external environment.

As described above in an example embodiment of the present invention, heat sink(s), 339, 530, 730, 830, 930, and 1030 may be detachably installed and may facilitate repair or replacement of a faulty semiconductor package.

Figure 18:
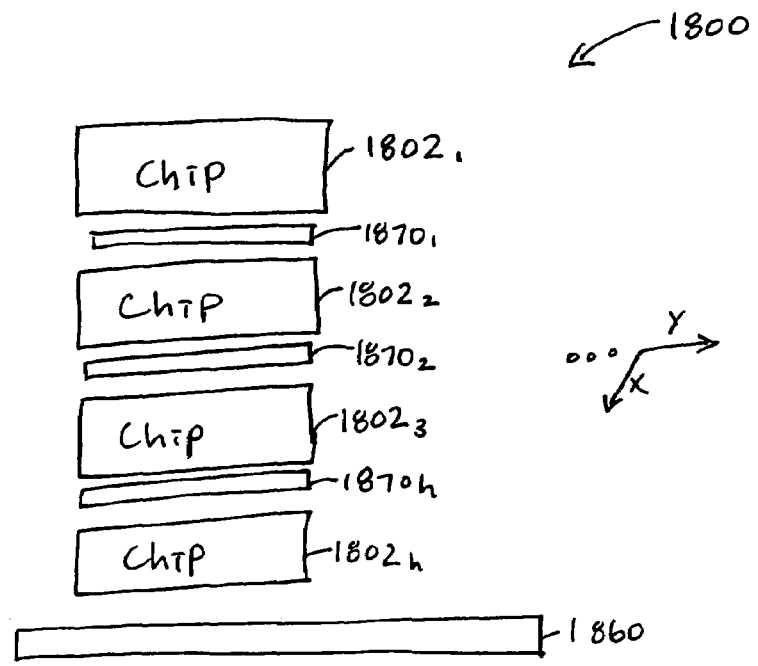
FIG. 18 illustrates a chip stack in accordance with an embodiment of the present invention.

FIG. 18 illustrates a chip stack 1800 in accordance with an embodiment of the present invention. Referring to FIG. 18, the chip stack 1800 may include chips 1802n (where n is an integer $\geq 1$), conductive elements $1870_{n-1}$ (where n is an integer $\geq 1$), and module board 1860. In example embodiments, an additional conductive element $1870_n$ may be placed between the chip 1802n and the module board 1860. Additional chip stacks 1800 may be placed in a one-dimensional array, for example in the x-direction or the y-direction, or in a two-dimensional array, for example, in both the x- and y-directions. Additional chip stacks 1800 may also be placed on another major surface of the module board 1860, for example, the lower surface of FIG. 18 to form a double-sided configuration.

Figure 19:
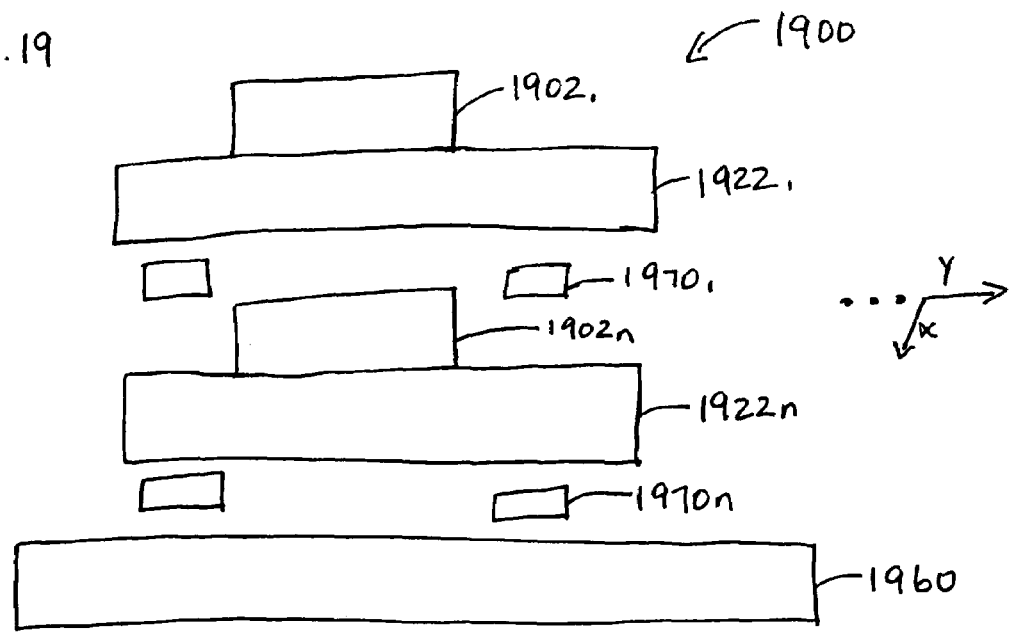
FIG. 19 illustrates a chip stack package in accordance with an embodiment of the present invention.

FIG. 19 illustrates a chip stack package 1900 in accordance with an embodiment of the present invention. Referring to FIG. 19, the chip stack 1900 may include chip packages 1902n (where n is an integer $\geq 1$), package boards $1922_n$ (where n is an integer $\geq 1$), conductive elements 1970n1 (where n is an integer $\geq 1$), and module board 1960. In example embodiments, an additional conductive element $1970_n$ may be placed between the chip $1902n$ and the module board 1960. Additional chip stack packages 1900 may be placed in a one-dimensional array, for example in the x-direction or the y-direction, or in a two-dimensional array in both the x- and y-directions. Additional chip stacks 1900 may also be placed on another major surface of the module board 1960, for example, the lower surface of FIG. 19 to form a double-sided configuration.

Example embodiments of the present invention are also directed to methods of manufacturing a semiconductor chip, package, or module, for example, any of the semiconductor chips, packages, or modules described above. For example, a method of manufacturing a semiconductor chip, package, or module may include providing a board (for example, a package board or a module board) having one or more active areas, placing a conductive element on one or more of the active areas, placing a chip, package, or module on the conductive element, and applying pressure to the board, the conductive element, and the chip, package, or module.

Example embodiments of the present invention are also directed to methods of disassembling a semiconductor chip, package, or module, for example, any of the semiconductor chips, packages, or modules described above. For example, a method of disassembling a semiconductor chip, package, or module may include removing pressure holding a board (for example, a package board or a module board), at least one conductive element, and at least one chip, package, or module together and removing the at least one chip, package, or module. In example embodiments, the removed chip, package, or module may be faulty or defective.

Example embodiments of the present invention are also directed to methods of replacing a defective chip, package, or module in a semiconductor package or module, for example, any of the semiconductor chips, packages, or modules described above. For example, a method of replacing a defective chip, package, or module in a semiconductor module may include removing pressure holding a board (for example, a package board or a module board), a conductive element, and the defective chip, package, or module together, removing the defective chip, package, or module from the conductive element, placing an operational chip, package, or module on the conductive element, and supplying pressure to the semiconductor module to facilitate an electrical connection between the board and the operational chip, package, or module via the conductive element.

As another example, a method of replacing a defective chip, package, or module in a semiconductor package or module may include removing pressure holding a board (for example, a package board or a module board), at least one conductive element, and the defective chip, package, or module together and removing the defective chip, package, or module.

As yet another example, the method may further include placing an operational chip, package, or module on the conductive element and supplying pressure to the board (for example, a package board or a module board), the at least one conductive element, and the operational chip, package, or module.

Example embodiment of the present invention may be utilized to test chips, packages, or modules or to manufacture chips, packages, or modules for operational use.

Example methods of replacing a defective chip, package, or module in a semiconductor package or module may be applied to semiconductor packages or modules that were originally manufactured with methods of manufacturing and/ or disassembled with methods of disassembling in accordance with example embodiments of the present invention.

Example methods of replacing a defective chip, package, or module in a semiconductor package or module may also be applied to semiconductor packages or modules that were originally manufactured and/or repaired with conventional reflow techniques.

As set forth, the present invention may be embodied in varied forms with many different features, the various features being combinable in all possible permutations, and not limited to the numerous, example combinations set forth above.

It will be apparent to those skilled in the art that other changes and modifications may be made in the above-described example embodiments without departing from the scope of the invention herein, and it is intended that all matter contained in the above description shall be interpreted in an illustrative and not a limiting sense.

What is claimed is:

1. A semiconductor module, comprising:
 a first chip package;
 a module board;
 a first conductive element provided between the first chip package and the module board; and
 a protector for applying pressure to the first conductive element, the module board, and the first chip package,
 wherein the first conductive element includes a layer having a central opening and conductive pads, wherein the layer is made of rubber or silicon rubber and the conductive pads are completely around the perimeter of the opening and include metal particles, gold particles, metal particles coated with gold, or nickel particles coated with gold.

2. The semiconductor module of claim 1, wherein the conductive pads of the first conductive element electrically connect the first chip package to the module board.

3. The semiconductor module of claim 1, wherein the nickel particles coated with gold are 20-50 μm in diameter.

4. The semiconductor module of claim 1, wherein the first chip package is one of a ball grid array chip package and a land grid array chip package.

5. The semiconductor module of claim 1, wherein the first chip package includes a plurality of chips and a substrate.

6. The semiconductor module of claim 1, wherein the first chip package includes a plurality of chips and a plurality of substrates.

7. The semiconductor module of claim 1, wherein the protector further acts as a heat sink for the first chip package.

8. The semiconductor module of claim 7, wherein the heat sink is connected to the module board to create the pressure applied to the first conductive element.

9. The semiconductor module of claim 7, wherein the heat sink is arranged adjacent to the first chip package and the module board and the protector is a "U" type clip to create the pressure applied to the first conductive element.

10. The semiconductor module of claim 7, wherein the heat sink includes a first portion adjacent to the first chip package and a second portion adjacent to the module board, wherein the first portion and the second portion are secured together.

11. The semiconductor module of claim 10, wherein the first portion and the second portion are secured together with one or more bolt and nut.

12. The semiconductor module of claim 10, wherein the first portion and the second portion are secured together with a compression clip.

13. The semiconductor module of claim 12, wherein the first portion adjacent to the first chip package and the second portion adjacent to the module board form a pocket for the first chip package and the first conductive element.

14. The semiconductor module of claim 7, further comprising:
a thermally conductive element interposed between the first chip package and the heat sink or between the first chip package and the module board.

15. The semiconductor module of claim 1, further comprising a heat sink for the first chip package.

16. The semiconductor module of claim 1, further comprising:
a second chip package;
a second conductive element provided between the first chip package and the second chip package,
the protector applying pressure to the first chip package, the first conductive element, the second chip package, the second conductive element, and the module board.

17. The semiconductor module of claim 1, further comprising:
a second chip package;
a second conductive element provided between the module board and the second chip package,
the protector applying pressure to the first chip package, the first conductive element, the second chip package, the second conductive element, and the module board.

18. A semiconductor module, comprising:
a first chip package;
a module board;
a first conductive element provided between the first chip package and the module board;
a protector for applying pressure to the first conductive element, the module board, and the first chip package;
a first chip package array including the first chip package;
a first conductive element array including the first conductive element, each first conductive element of the first conductive element array provided between each chip package of the first chip package array and the module board;
the protector applying pressure to each conductive element of the first conductive element array, each chip package of the first chip package array, and the module board, and wherein the first conductive element includes a layer having a central opening and conductive pads, and wherein the layer is made of rubber or silicon rubber and the conductive pads are completely around the perimeter of the opening and include metal particles, gold particles, metal particles coated with gold, or nickel particles coated with gold.

19. The semiconductor module of claim 18, wherein the protector further acts as a plurality of heat sinks for the first chip package array, and further includes a plurality of U-type clips arranged to create the pressure applied to the first conductive element array, the first chip package array, the plurality of heat sinks, and the module board.

20. The semiconductor module of claim 18, further comprising a plurality of heat sinks, the protector including a plurality of U-type clips arranged to create the pressure applied to the first conductive element array, the first chip package array, the plurality of heat sinks, and the module board.

21. The semiconductor module of claim 18, further comprising:
a second chip package array, including a plurality of second chip packages;
a second conductive element array, each second conductive element of the second conductive element array provided between each chip package of the second chip package array and each chip package of the first chip package array;
the protector applying pressure to the first conductive element array and the second conductive element array.

22. The semiconductor module of claim 21, wherein the protector further acts as a plurality of heat sinks for the first chip package array and the second chip package array, and further includes a plurality of U-type clips arranged to create the pressure supplied to the first conductive element array, the first chip package array, the second chip package array, the second conductive element array, the plurality of heat sinks, and the module board.

23. The semiconductor module of claim 21, further comprising a plurality of heat sinks, the protector including a plurality of U-type clips arranged to create the pressure applied to the first conductive element array, the first chip package array, the second chip package array, the second conductive element array, the plurality of heat sinks, and the module board.

24. The semiconductor module of claim 18, further comprising:
a second chip package array, including a plurality of second chip packages;
a second conductive element array, each second conductive element of the second conductive element array provided between each chip package of the second chip package array and the module board;
the protector applying pressure to the first conductive element array and the second conductive element array.

25. The semiconductor module of claim 24, wherein the protector further acts as a plurality of heat sinks for the first chip package array and the second chip package array, the protector including a plurality of U-types clip arranged to create the pressure applied to the first conductive element array, the first chip package array, the second chip package array, the second conductive element array, the plurality of heat sinks, and the module board.

26. The semiconductor module of claim 24, further comprising a plurality of heat sinks and a plurality of U-type clips arranged to create the pressure applied to the first conductive element array, the first chip package array, the second chip package array, the second conductive element array, the plurality of heat sinks, and the module board.

27. The semiconductor module of claim 24, further comprising:
a third chip package array, including a plurality of third chip packages;
a third conductive element array, each third conductive element of the third conductive element array provided between each chip package of the first chip package array and the each chip package of the third chip package array;
a fourth chip package array, including a plurality of fourth chip packages;
a fourth conductive element array, each fourth conductive element of the fourth conductive element array provided between each chip package of the second chip package array and the each chip package of the fourth chip package array;
the protector applying pressure to the first conductive element array, the second conductive element array, the third conductive element array, and the first conductive element array conductive element array.

28. The semiconductor module of claim 27, wherein the protector further acts as a plurality of heat sinks for the first chip package array, the second chip package array, the third chip package array and the fourth chip package array, and further includes a plurality of U-type clips arranged to create the pressure applied to the first conductive element array, the first chip package array, the second chip package array, the second conductive element array, the third chip package array, the third conductive element array, the fourth chip package array, the fourth conductive element array, the plurality of heat sinks, and the module board.

29. The semiconductor module of claim 27, further comprising a plurality of heat sinks arranged adjacent to each chip package of the third chip package array and each chip package of the fourth chip package array to create the pressure applied to the first conductive element array, the first chip package array, the second chip package array, the second conductive element array, the third chip package array, the third conductive element array, the fourth chip package array, the fourth conductive element array, the plurality of heat sinks, and the module board.

30. A semiconductor module, comprising:
a first chip package;
a second chip package;
a first conductive element provided between the first chip package and the second chip package; and
a protector for applying pressure to the first conductive element,
wherein the first conductive element includes a layer having a central opening and conductive pads, and wherein the layer is made of rubber or silicon rubber and the conductive pads are completely around the perimeter of the opening and include metal particles, gold particles, metal particles coated with gold, or nickel particles coated with gold.

* * * * *